United States Patent [19]

Kuwatsuka

[11] Patent Number: 5,751,758
[45] Date of Patent: May 12, 1998

[54] PHASE CONJUGATE WAVE GENERATING DEVICE, WAVELENGTH CONVERTING METHOD, OPTICAL DISPERSION COMPENSATING METHOD AND MULTI-WAVELENGTH LIGHT GENERATING DEVICE

[75] Inventor: Haruhiko Kuwatsuka, Kanagawa, Japan

[73] Assignee: Fujitsu Limited, Kawasaki, Japan

[21] Appl. No.: 746,646

[22] Filed: Nov. 13, 1996

[30] Foreign Application Priority Data

Nov. 15, 1995 [JP] Japan ........................ 7-296524
Sep. 20, 1996 [JP] Japan ........................ 8-250710

[51] Int. Cl.$^6$ .................................................. H01S 3/08
[52] U.S. Cl. ........................... 372/96; 372/23; 372/34
[58] Field of Search ............................ 372/96, 31, 23, 372/34

[56] References Cited

FOREIGN PATENT DOCUMENTS

95/03653  2/1995  European Pat. Off. .
62-0271153  10/1987  Japan .

OTHER PUBLICATIONS

IEEE Journal of Quantum Electronics, vol. 29, No. 6, Jun. 1993, New York US, pp. 1477–1487.
Journal of Lightwave Technology, vol. 11, No. 12, Dec. 1, 1993 pp. 2026–2032.
Applied Physics Letters, vol. 58, No.14, Apr. 8, 1991, pp. 1458–1460.
Narrow linewidth and wavelength tunable multiple quantum well λ/4 shifted distributed feedback laser—Y. Kotaki et al. OFC'90/Thursday Morning/159.

Observation of highly nondegenerate four–wave mixing (>1 THz) in an InGaAsP multiple quantum well laser —S. Murate et al. Appl. Phys. Lett. 58 (14), pp. 1458–1460—8 Apr. 1991.

Four–wave mixing in traveling–wave semiconductor amplifiers. A Mecozzi et al., IEEE Journal of Quantum Electronics, vol. 31, No. 4, pp. 689–699—Apr. 1995.

THz frequency conversion using nondegenerate four–wave mixing process in a lasing long–cavity λ/4–shifted DFB laser. H. Kuwatsuka et al. Electronic Letter—vol. 31, No.24, pp. 2108–2110 23rd Nov. 1995.

Nanometer wavelength conversion of picosecond optical pulses using cavity–enhanced highly nondegenerate four–wave mixing in semiconductor laser. P. P. Iannone et al. IEEE Journal of Quantum Electronics, vol.31, No.7 pp. 1285–1291—Jul. 1995.

*Primary Examiner*—Leon Scott, Jr.
*Attorney, Agent, or Firm*—Armstrong, Westerman, Hattori, McLeland & Naughton

[57] ABSTRACT

There is provided a device comprising a distributed feedback semicon-ductor laser having λ/4 phase shift diffraction grating and antireflection films coated on a light input end and a light output end to transmit phase conjugate wave, a probe beam light source for injecting the probe beam into the light input end of the distributed feedback semiconductor laser, a current supplying means for supplying electric current to the distributed feedback semiconductor laser to oscillate pump beam, and a lens system for extracting phase conjugate wave which is output from the light output end of the distributed feedback semiconductor laser by injecting the probe beam into the distributed feedback semiconductor laser which is oscillating the pump beam.

14 Claims, 6 Drawing Sheets

$$\nu_0 = |\nu_1 - \nu_2|$$

PHASE CONJUGATE WAVE GENERATING DEVICE, WAVELENGTH CONVERTING METHOD, OPTICAL DISPERSION COMPENSATING METHOD AND MULTI-WAVELENGTH LIGHT GENERATING DEVICE

BACKGROUND OF THE INVENTION

1. Field of the Invention

The present invention relates to a phase conjugate wave generating device, a wavelength converting method, an optical dispersion compensating method, and a multi-wavelength light generating device. More particularly, the present invention relates to a device for generating a phase conjugate wave by using nondegenerative four-wave mixing (NDFWM), a method of converting wavelength by using NDFWM, a method of compensating for optical dispersion with the use of NDFWM, and a device for generating plural lights having different wavelengths.

2. Description of the Prior Art

Various investigations as with phase conjugate wave have been carried out since using phase conjugate wave to compensate for dispersion in optical fibers used in optical communication, application of phase conjugate wave to a wavelength converting mechanism in feature wavelength multiplication communication, and the like may be expected. As shown in FIG.1, in wavelength multiplication communication without phase conjugate wave, not only semiconductor lasers 101 to 107 must be prepared as many as the number of different wavelength but also output lights from these semiconductor lasers 101 to 107 must be superposed by an optical coupler 120 via optical fibers 111 to 117. Thus, system tends to increase in size and becomes complicated as the number of wavelength increases.

As methods of generating phase conjugate wave, for purposes of example, method of employing the optical non-linearly of an optical fiber, method of employing a traveling-wave type semiconductor laser amplifier, method of employing a semiconductor laser wavelength of which is fixed by injection of the light, etc. has been proposed.

The method of generating phase conjugate wave by making use of the traveling-wave type semiconductor laser amplifier has been recited in literature [1], i.e., A. Mecozzi et al., IEEE JOURNAL OF QUANTUM ELECTRONICS, VOL.31, NO.4, April 1995, pp.689–699.

In this method, as shown in FIG.6 of this literature [1], a pump (excitation) beam and a probe beam (also called a "signal beam") are coupled by a directional coupler, then the pump beam and the probe beam coupled is input into the traveling-wave type semiconductor laser amplifier via a lens system and an optical isolation, and then phase conjugate wave is extracted from the traveling-wave type semiconductor laser amplifier.

The light output from a color center laser (CCL) is fed as the pump beam to the directional coupler via an optical isolator (OI), a Babinet-Soleil compensator, and a lens system. The light output from an external-cavity laser diode (ECLD) is fed as the probe beam to the directional coupler via the optical isolator, a λ/2 plate, and a λ/4 plate.

The method of generating phase conjugate wave with the use of the semiconductor laser in lieu of the semicon-ductor laser amplifier has been recited in literature [2], i.e., Patrick P. Iannone et al., IEEE JOURNAL OF QUANTUM ELECTRONICS, VOL.31, NO.7, July 1995, pp.1285–1291.

In this method, a device having similar mechanism to that given in the literature [1] has been employed except the use of the semiconductor laser. The semiconductor laser is formed to oscillate the light having the same wavelength as that of the pump beam injected externally.

These two methods are common in respects that both the pump beam and the probe beam are input into one end of the semiconductor laser amplifier or the semiconductor laser and that phase conjugate wave of the probe beam is extracted from the other end of the semiconductor laser amplifier or the semiconductor laser.

In contrast, the method of inputting externally the probe beam into the semiconductor laser oscillating the pump beam and outputting phase conjugate wave of the probe beam incident end has been set forth in literature [3], i.e., S. Murata et al., Appl. Phys. Lett. 58(14), 8 April 1991, pp.1458–1460.

However, according to the methods recited in the above literatures [1] and [2], since three optical devices such as a light source for generating the probe beam, a light source for generating the pump beam, and a semiconductor laser amplifier or semiconductor laser for generating phase conjugate wave is needed, a mechanism for coupling these components with each other becomes complicated correspondingly. In particular, an optical coupler for coupling the probe beam with the excitation beam with good efficient is required.

Moreover, in the method set forth in the literature [3], a Fabry-Perot mode resides in the semiconductor laser because there is necessity that a reflection film having high reflection factor on light non-output end of the semiconductor laser for outputting phase conjugate wave is formed. Accordingly, as described in the literature [3], wavelength of the phase conjugate wave is limited inevitably to the wavelength that resonates with the Fabry-Perot mode.

SUMMARY OF THE INVENTION

An object of the present invention is to provide a phase conjugate wave generating device for allowing a phase conjugate wave generating mechanism to be more simple and generating phase conjugate wave not depending upon a Fabry-Perot mode, a wavelength converting method for converting wavelength by generating such phase conjugate wave, a method for compensating for optical dispersion with the use of such phase conjugate wave, and a multi-wavelength light generating device for generating plural lights having different wavelengths.

According to an aspect of the present invention, since the DFB semiconductor laser is used as the semiconductor device to generate phase conjugate wave and a single mode light beam obtained by oscillating the DFB semiconductor laser is used as the pump beam, a mechanism for coupling the pump beam with the probe beam can be neglected to by that simplify the structure of the phase conjugate wave generating device. In addition, there is no necessity to consider attenuation of intensity of the pump beam due to the optical fiber, and intensity of the phase conjugate wave as the output light beam can be enhanced by the stronger pump beam.

Though the DFB semiconductor laser has a single oscillation mode, wavelength can be varied freely. For varying wavelength, for instance, distribution of the electric current supplied to the semiconductor laser may be altered in magnitude by splitting the electrode on one side of the DFB semiconductor laser into plural electrodes. Accordingly, it is possible to alter wavelength of the pump beam with the use of the DFB semiconductor laser. As a result, wavelength of the phase conjugate wave can be varied freely.

Since the phase conjugate wave (light beam) generated by the DFB semiconductor laser is output with the probe beam and the pump beam, the filter may be arranged on the output end side of the DFB semiconductor laser if only the phase conjugate wave light beam must be extracted.

Since waveform of the phase conjugate wave light beam appears as a reversal waveform of the probe beam if the DFB semiconductor laser is used, the DFB semiconductor laser can be used to compensate for dispersion in the optical fiber.

According to another aspect of the present invention, the loop-like optical path is provided such that the input end of one DFB semiconductor laser having different oscillation wavelength is connected to the output end of the other DFB semiconductor laser and then the input end of the other DFB semiconductor laser is connected to the output end of one DFB semiconductor laser, and the light beam in the optical path is extracted to the outside by the directional branch coupler or the like.

Since plural light beams having different wavelengths and passing through in the loop-like optical path may serve as the probe beam, plural phase conjugate waves having different wavelengths may be generating every DFB semiconductor laser. Therefore, since the multi-wavelength light generating device may consist of at least two DFB semiconductor lasers, the optical fiber, and the light outputting device to miniaturize the size, the device can be miniaturized and time and labor required for assembling can be reduced because of reduction in the number of connecting points between the optical parts and the optical device.

Also, insertion of the etalon in the loop-like optical path allows intensity of the light beam to be amplified. Besides, if the isolator is inserted in the loop-like optical path, component of the light beam proceeding in the reverse direction can be decreased.

Since interval between wavelengths of the light beam can be changed by varying wavelength of the DFB semiconductor laser, wavelength of the output light beam can be readily adjusted.

Other and further objects and features of the present invention will become obvious upon an understanding of the illustrative embodiments about to be described concerning the accompanying drawings or will be suggested in the appended claims, and various advantages not referred to herein will occur to one skilled in the art upon employing of the invention in practice.

DESCRIPTION OF THE PREFERRED EMBODIMENTS

Figure 1:
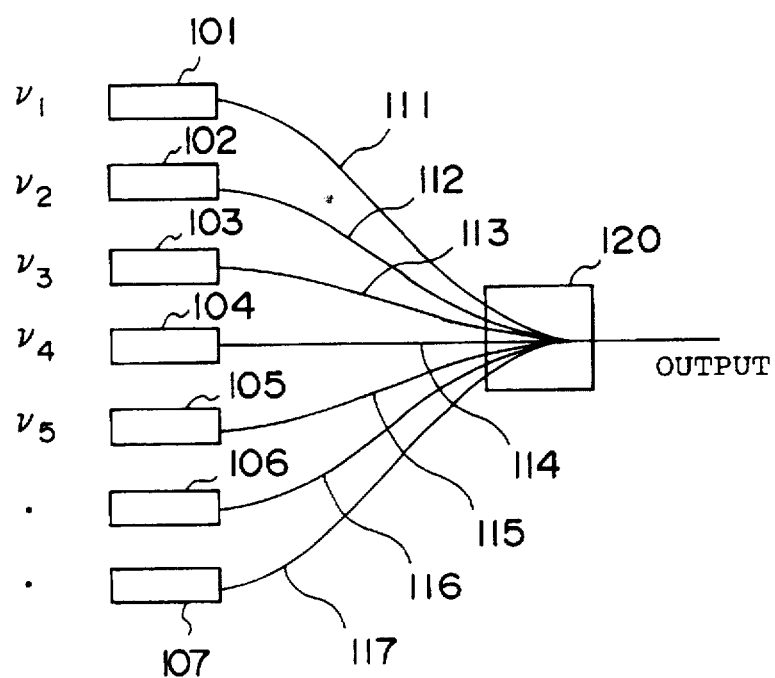
FIG. 1 is a view showing an example of a type of conventional device for entering plural lights having different wavelengths into an optical fiber.

There will be described various embodiments of the present invention about the accompanying drawings. It is to be noted that the same or similar reference numerals are applied to the same or similar parts and elements throughout the drawings, and the description of the same or similar parts and elements will be omitted or simplified.

Figure 2:
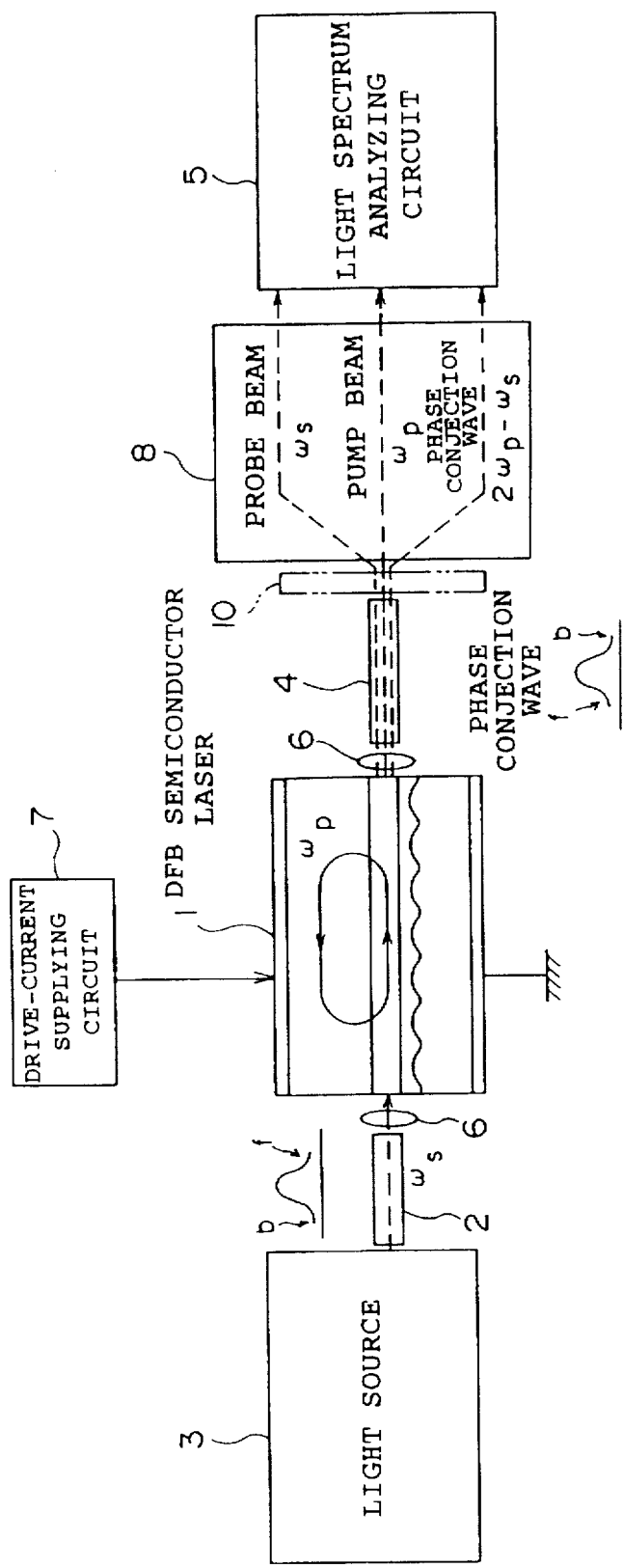
FIG. 2 is a view showing a type of phase conjugate wave generating device according to an embodiment of the present invention.

FIG. 2 is a view showing a configuration of a phase conjugate wave generating device according to an embodiment of the present invention with the use of NDFWM.

In FIG. 2, a variable wavelength light source 3 is connected to one end (light incident end) of the DFB semiconductor laser 1 via a first optical fiber 2. A light spectrum analyzing circuit 5 is connected to the other end (light emitting end) of the DFB semiconductor laser 1 via a second optical fiber 4 and a light receiving device 8.

Figure 3A:
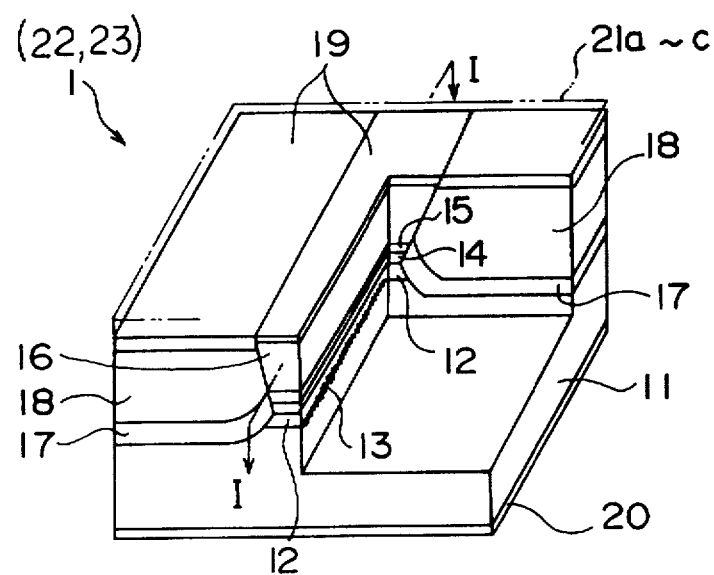
FIG. 3A is a perspective view, partially cut away, showing a DFB semiconductor laser for use in the phase conjugate wave generating device according to the embodiment of the present invention.
Figure 3B:
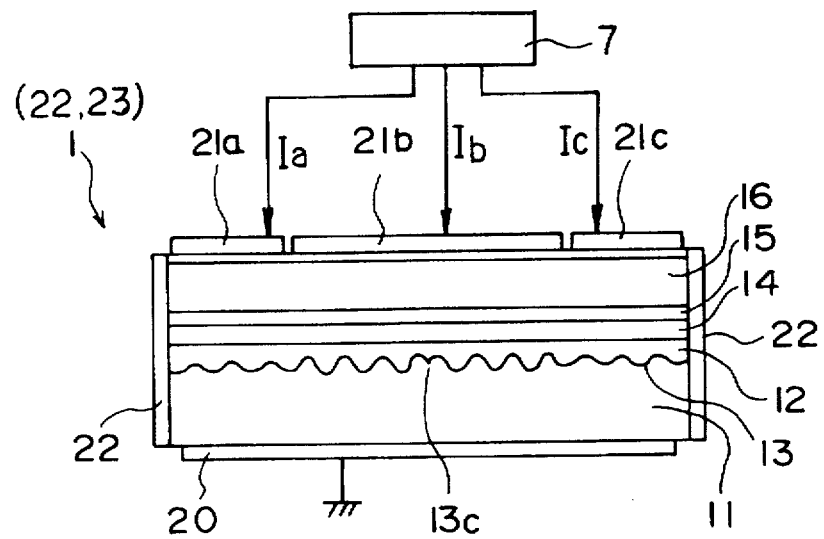
FIG. 3B is a sectional view showing the DFB semiconductor laser taken along a line I—I in FIG. 3A.

The DFB semiconductor laser 1 has a structure shown in FIGS. 3A and 3B, for example.

In FIG. 3A, an n-InGaAsP guide layer 12 is formed on an upper surface of an n-InP substrate 11. A corrugated diffraction grating 13 with a film thickness which varies periodically in the light passing direction is formed on a junction surface between the guide layer 12 and the substrate 11. As shown in FIG. 3B, the diffraction grating 13 has in the central portion 13c a phase shift type in which the period is shifted by $\lambda/4$ (where $\lambda$ is wavelength of light in the waveguide).

An undoped multiple quantum well (MQW) active layer 14 is formed on the guide layer 12, and a p-InGaAsP buffer layer 15 and a p-InP layer 16 are formed on the active layer 14. The MQW active layer 14 is formed such that five layers of 7 nm thick $In_{x'}Ga_{1-x'}As(x'=0.532)$ well layers and five layers of 10 nm thick $Ga_xIn_{1-x}As_yP_{1-y}(x=0.283, y=0.611)$ barrier layers are alternatively stacked.

The p-InP layer 16 to an upper portion of the n-InP substrate 11 are patterned to assume a convex portion in section. A plan shape of the convex portion is a stripe shape extending in the light passing direction. A p-InP layer 17 and a n-InP layer 18 are formed in sequence on the n-InP substrate 11 on both sides of the stripe-like convex portion. A p-InGaAsP layer 19 is formed on the uppermost layer, i.e., the p-InP layer 16 and the n-InP layer 18.

An n side electrode 20 is formed on a lower surface of the n-InP substrate 11. In addition, three split p side electrodes 21a, 21b, 21c are formed on the p-InGaAsP layer 19.

An energy band gap of n-InP is larger than the active layer 14. And, InP around the active layer 14 is a cladding layer.

Reflection-free films 22 are coated on both end surfaces of the DFB semiconductor laser 1 respectively to transmit at least phase conjugate wave. Merely by way of example, a resonator length of the DFB semiconductor laser 1 is 900 µm, a length of the p side electrode 21b formed in the center area is about 580 µm, lengths of the p-side electrodes 21a, 21c formed on the side areas are 160 µm.

In FIG. 2, a reference 6 denotes a focusing lens, and a reference 7 denotes a driving current supplying circuit for supplying a drive current to the DFB semiconductor laser 1.

Subsequently, an operation of the above phase conjugate wave generating device will be explained.

At first, by supplying a drive current to the n side electrode 20 of the DFB semiconductor laser 1 from the p side electrodes 21a, 21b, 21c via the MQW active layer 14, a light with wavelength of 1549 nm can be continuously oscillated from one end of the MQW active layer 14 at an output of 40 mW. In this case, electric currents with the same magnitude such as 400 mA are supplied to respective p side electrodes 21a, 21b, 21c.

Since the light beam oscillated from the DFB semiconductor laser 1 has a single laser mode and a narrow line width in the wavelength band, oscillating light has a stable wavelength. Therefore, the light beam of angular frequency $\omega_p$ oscillated by the DFB semiconductor laser 1 may be used as the pump beam (excitation beam).

Next, the probe beam of wavelength 1574 nm is output from a variable wavelength light source 3. Then, the probe beam is input into an input end of the DFB semiconductor laser 1 via a first optical fiber 4 and a focusing lens 6. At this time, spectrum of the light beam output from the other end of the DFB semiconductor laser 1 has been examined by making use of a light spectrum analyzing circuit 5. The result of such examination is shown in FIG. 4.

Figure 4:
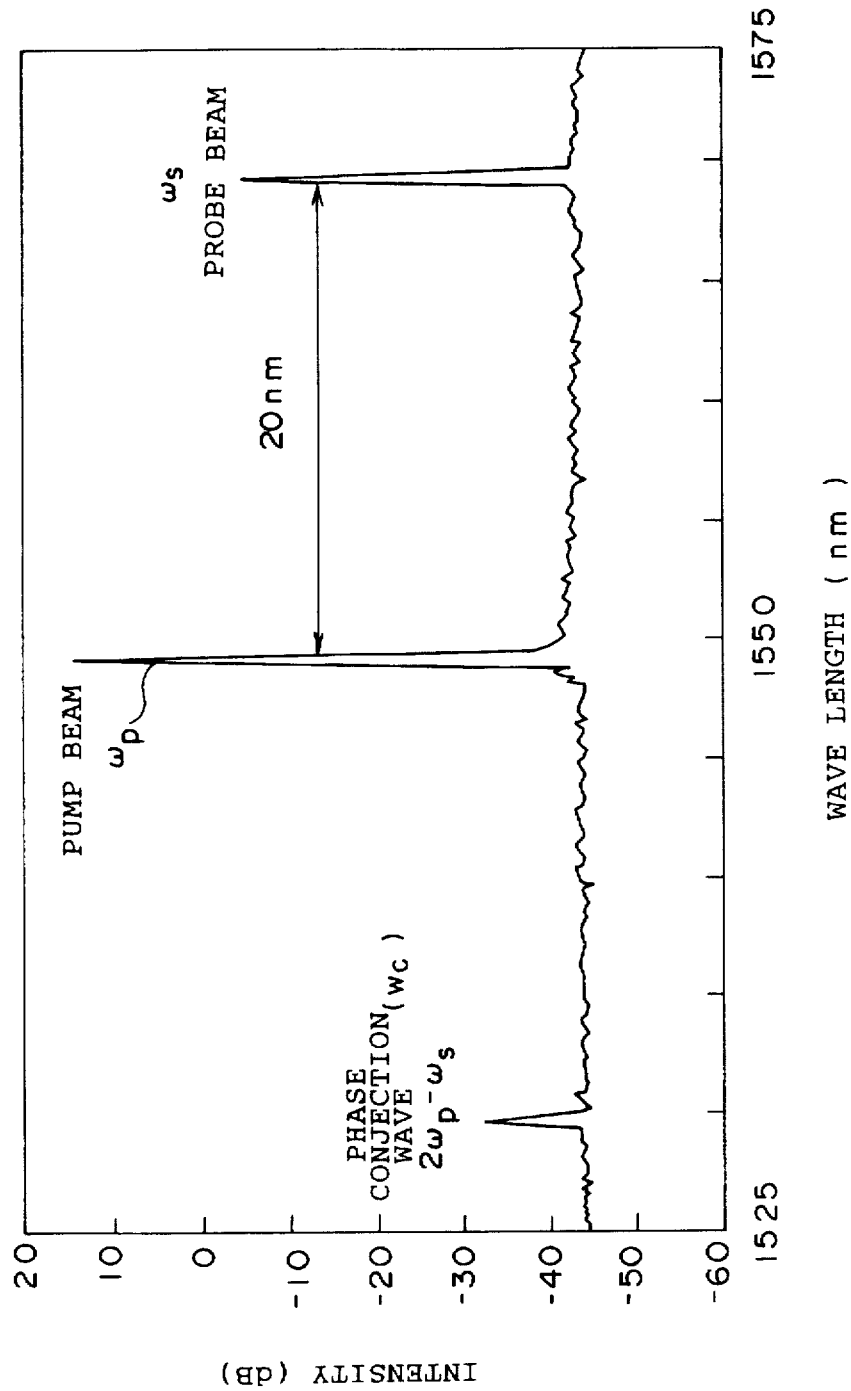
FIG. 4 is a graph showing an example of spectrum derived from the phase conjugate wave generating device according to the embodiment of the present invention.

In FIG. 4, in addition to a spectrum peak of the pump beam at a wavelength of 1549 nm and a spectrum peak of the probe beam at a wavelength of 1574 nm, another spectrum peak exists at a wavelength of 1524 nm. As a result, it could be seen that a third beam other than the pump beam and the probe beam can be output from the DFB semiconductor laser 1.

Let $\omega_s$ be the angular frequency of the probe beam and $\omega_c$ is the angular frequency of the third beam, it has been found that the third light beam is phase conjugate wave since the following equation (1) can be deduced from the experimental results in FIG. 4.

$$\omega_c = 2\omega_p - \omega_s \quad (1)$$

Among angular frequency $\omega$ of the light beam, frequency $\nu$ of the light beam, and wavelength $\lambda$ of the light beam, relationships $\omega=2\pi\nu$, $\lambda=v/\nu$ can be satisfied. Where v is light velocity.

As stated earlier, if the pump beam is generated in the DFB semiconductor laser 1, a mechanism for coupling the probe beam with the pump beam can be omitted, thus result in simplification of a configuration of the phase conjugate wave generating device. Hence, miniaturization of an optical communication device into which such device is incorporated can be accomplished.

Without regards to attenuation in intensity of the pump beam through the optical fiber, intensity of the phase conjugate wave serving as the output light beam can be enhanced by stronger pump beam rather than that in the conventional device since the pump beam is generated in the DFB semiconductor laser 1. This is because intensity of phase conjugate wave varies directly as square of intensity of the pump beam.

Next, distribution of electric current supplied to the p side electrodes 21a, 21b, 21c of the DFB semiconductor laser 1 will be explained.

Such event has been set forth in Y. KOTAKI et al., OFC '90, THURSDAY MORNING, 159 that, if magnitude of electric currents Ia, Ib, Ic supplied to three p side electrodes 21a, 21b, 21c is set differently, a single oscillation mode (wavelength) of the DFB semiconductor laser 1 is shifted.

For instance, by increasing the electric current Ib injected into the central p side electrode 21b while keeping the electric currents Ia, Ic injected into the p side electrodes 21a, 21c formed near both ends of the DFB semiconductor laser 1 constant, shift of oscillation wavelength towards the longer wavelength side would occur. The electric currents supplied to respective p side electrodes 21a, 21b, 21c can be adjusted by a drive-current supplying circuit 7.

Thus, if the DFB semiconductor laser 1 having a plurality of p side electrodes 21a, 21b, 21c shown in FIG. 3B and the reflection-free films 22 on its both ends is used, wavelength of phase conjugate wave can be altered freely by varying wavelength of the pump beam.

As discussed above, with the use of the above phase conjugate wave generating device, wavelength conversion can be attained in the wavelength multiplication communication.

Meanwhile, the phase conjugate wave output from the above DFB semiconductor laser 1 exists axially symmetrically to the probe beam with respect to the pump beam. For this reason, as shown in FIG. 2, in case the probe beam is pulse-modulated to have a longer wavelength $\lambda_f$ at a front portion of the pulse and a shorter wavelength $\lambda_b$ at a rear portion of the pulse, waveform the phase conjugate wave is deformed such that wavelength is shortened like $\lambda_b$ at a front portion of the pulse of the probe beam and is lengthened like $\lambda_f$ at a rear portion thereof.

By putting this phenomenon into practice, with passing through the first optical fiber 2 having a length of 50 km, for example, the pulse-like probe beam (signal light beam) is spread because of dispersion in the optical fiber and then input into the DFB semiconductor laser 1, so that the phase conjugate wave also assumes a spread waveform. In this case, wavelength is lengthened at the front portion of the pulse of the probe beam rather than the rear portion thereof.

However, waveform of the phase conjugate wave appears as a reversal of waveform of the probe beam in size of wavelength at the front and rear portions. Therefore, if the second optical fiber 4 is 50 km in length, for example, pulse waveform of the light beam is compressed as the light beam proceeds in the second optical fiber 4, so that the pulse waveform is deformed desirably to have the original narrow pulse width. This is because longer wavelength components of the pulse tends to travel more quickly in the optical fiber rather than shorter wavelength components of the pulse.

Subsequently, explanation will be made of a light generating device for generating a light having different frequencies with the use of a plurality of above phase conjugate wave generating devices.

Figure 5:
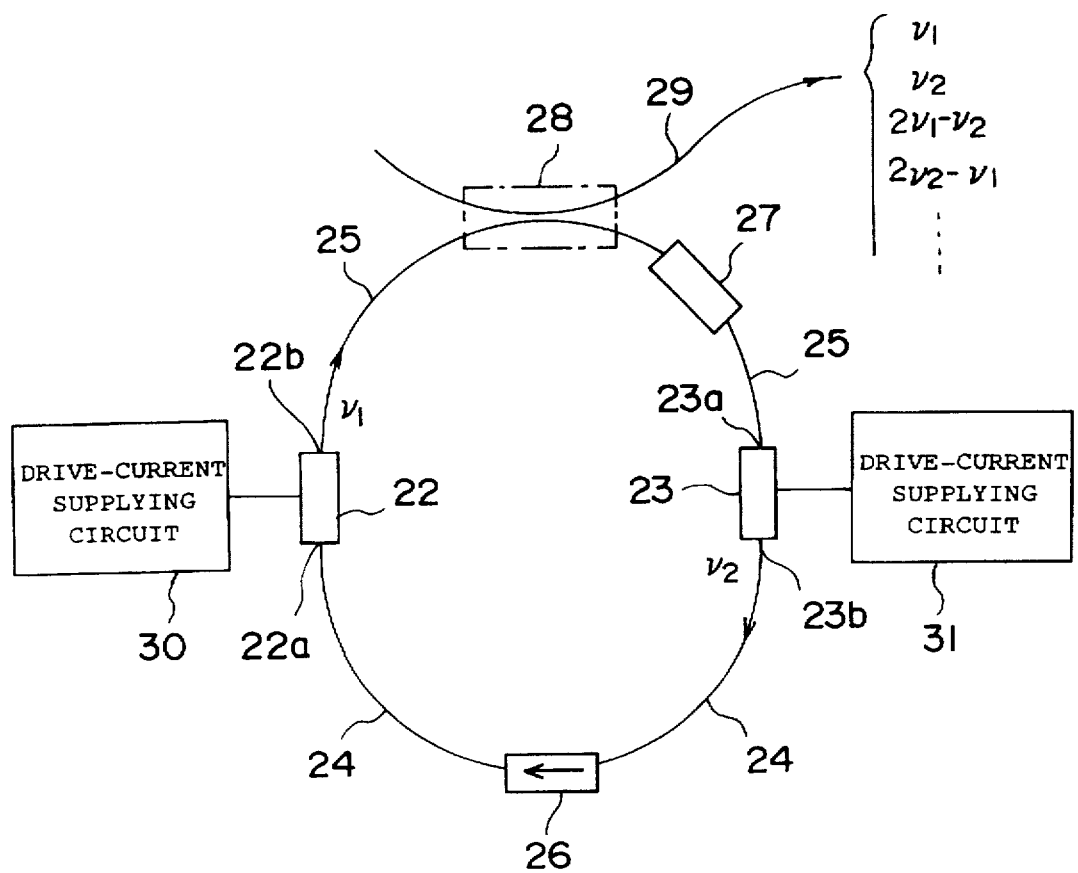
FIG. 5 is a view showing an example of a configuration of a multi-wavelength light generating device to which the phase conjugate wave generating device according to the embodiment of the present invention is applied.

FIG. 5 shows a multi-wavelength light generating device which generates plural lights at predetermined frequency interval by using two DFB semiconductor lasers each having a different oscillation wavelength.

A first DFB semiconductor laser 22 and a second DFB semiconductor laser 23 are formed to have substantially identical configurations to that shown in FIGS. 3A and 3B, but such DFB semiconductor lasers have different oscillation wavelengths since they are formed to have either different pitches of diffraction grating 13 or different compositions of well layers and barrier layers in the MQW layers 14. Where, let $\nu_1$ be the frequency of oscillation beam of the first DFB semiconductor laser 22 and $\nu_2$ be the frequency of oscillation beam of the second DFB semiconductor laser 23.

An input end 22a of the first DFB semiconductor laser 22 is connected to an output end 23b of the second DFB semiconductor laser 23 via a first optical fiber 24. An input end 23a of the second DFB semiconductor laser 23 is connected to an output end 22b of the first DFB semiconductor laser 22 via a second optical fiber 25. Thus, the first DFB semiconductor laser 22 and the second DFB semiconductor laser 23 are in the same condition as they are connected in series to a loop-like optical path.

Further, in the optical loop in FIG. 5, an isolator 26 is connected to the first optical fiber 24 in serial so as to advance the light beam clockwise in the first optical fiber 24, for instance. The isolator 26 is provided to prevent return reflection along the optical path.

Furthermore, a Fabry-Perot etalons 27 with frequency $(v_1-v_2)$ is connected to a second optical fiber 25 in series. Such a configuration may be considered as the Fabry-Perot etalons 27 that, for instance, two flat glasses are provided in parallel and a reflection layer is formed between inner surfaces of these parallel flat glasses.

Moreover, a directional branch coupler 28 having almost X-shape optical paths is connected to the second optical fiber 25. Parts of the second optical fiber 25 are connected in series to optical paths on one side of the directional branch coupler 28, while optical paths on the other side of the directional branch coupler 28 are connected to the external devices via a third optical fiber 29.

A first drive-current supplying circuit 30 is connected to the first DFB semiconductor laser 22 and a second drive-current supplying circuit 31 is connected to the second DFB semiconductor laser 23.

The multi-wavelength light may be emitted from the multi-wavelength light generating device composed as above as follows.

First, by supplying electric currents from the first drive-current supplying circuit 30 and the second drive-current supplying circuit 31 to the first DFB semiconductor laser 22 and the second DFB semiconductor laser 23 respectively, a first light beam of frequency $v_1$ may be oscillated from the first DFB semiconductor laser 22 and a second light beam of frequency $v_2$ may be oscillated from the second DFB semiconductor laser 23.

The first light beam and the second light beam emitted from the first DFB semiconductor laser 22 and the second DFB semiconductor laser 23 respectively proceed clockwise in the first optical fiber 24 and the second optical fiber 25. Then, the first light beam of frequency $v_1$ is input into an input end of the second DFB semiconductor laser 23 while the second light beam of frequency $v_2$ is input into an input end of the first DFB semiconductor laser 22.

Since the frequency $v$ is expressed by $\omega/2\pi$, the light beam of frequency given by relationship of the above equation (1) in the following is present in the loop-like optical path.

At first, a third light beam of frequency $v_3$ given by the following equation (2) is output from the first DFB semiconductor laser 22 to which the second light beam of frequency $v_2$ is input.

$$v_3=2v_1-v_2=v_1+(v_1-v_2) \quad (2)$$

Similarly, a fourth light beam of frequency $v_4$ given by the next equation (3) is output from the second DFB semiconductor laser 23 to which the first light beam of frequency $v_1$ is input.

$$v_4=2v_2-v_1=v_2-(v_1-v_2) \quad (3)$$

Further, when the fourth light beam is input into the first DFB semiconductor laser 22 via the optical fiber, it may serve as the probe beam and then a fifth light beam of frequency $v_5$ given by the equation (4) as well as the first and third light beams is output from an output end of the second DFB semiconductor laser 23.

$$v_5=2v_1-v_4=2v_1-(2v_2-v_1)=(v_1-v_2)+(v_1-v_2)=v_3+(v_1-v_2) \quad (4)$$

Furthermore, when the third light beam is input into the second DFB semiconductor laser 23 via the optical fiber, it may serve as the probe beam and then a sixth light beam of frequency $v_6$ given by the equation (5) as well as the second and fourth light beams is output from the output end of the second DFB semiconductor laser 23.

$$v_6=2v_2-v_3=2v_2-(2v_1-v_2)=(2v_2-v_1)-(v_1-v_2)=v_4-(v_1-v_2) \quad (5)$$

As evident from the above, plural light beams having frequencies at a $(v_1-v_2)$ interval with respect to frequency $v_1$ of the pump beam for the device may be output from the first DFB semiconductor laser 22 whereas plural light beams having frequencies at a $-(v_1-v_2)$ interval with respect to frequency $v_2$ of the pump beam for the device may be output from the second DFB semiconductor laser 23.

The same relations as given by the equations (2) to (5) may be satisfied with respect to $1/\lambda$ of respective light beams.

It is assumed, by way of example, that oscillation wavelength and oscillation light output of the first DFB semiconductor laser 22 are 1550 nm and 40 mW respectively and oscillation wavelength and oscillation light output of the second DFB semiconductor laser 23 are 1552 nm and 40 mW respectively, then eight different wavelength light beams having output of about 1 mW can be emitted at an approximate 2 nm wavelength interval.

Such wavelength interval may be varied by changing oscillation wavelength (pump beam) of the first or second DFB semiconductor laser 22 or 23, for example.

Figure 6:
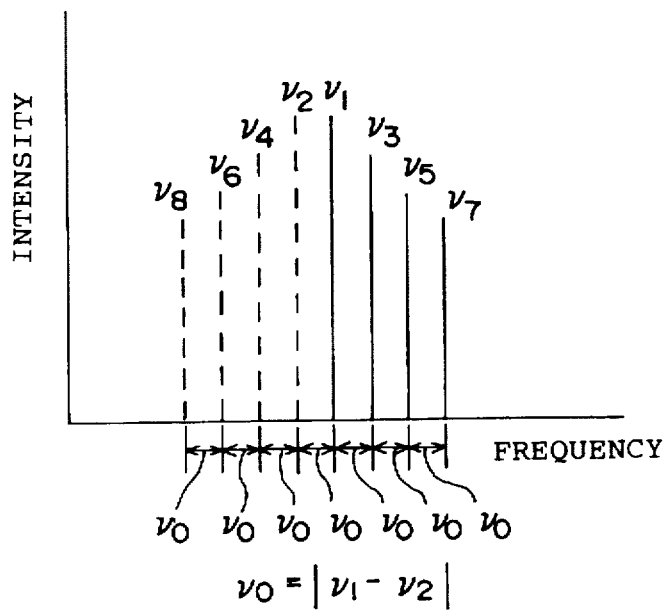
FIG. 6 is a view showing an example of optical spectra having different frequencies generated by the phase conjugate wave generating device according to the embodiment of the present invention.

Also, in order to vary oscillation wavelength of the DFB semiconductor laser, as shown in FIG. 3B, the electrode formed on one side of the DFB semiconductor laser may be split into plural electrodes and then electric currents supplied to these plural electrodes may be adjusted. Instead of splitting the electrode of the DFB semiconductor laser, as shown in FIG. 6, a Peltier device 30 and a thermistor 31 may be brought into contact with the first or second DFB semiconductor laser 22 or 23, then temperature of to the first or second DFB semiconductor laser 22 or 23 may be detected by the thermistor 31 to input a temperature controlling circuit 32, and then temperature of the first and second DFB semiconductor lasers 22, 23 may be kept at a desired value while controlling electric current supplied to the Peltier device 30 by the temperature controlling circuit 32 in accordance with the detected temperature. This is because oscillation frequency of the DFB semiconductor laser varies within a predetermined range according to change in temperature.

Figure 7:
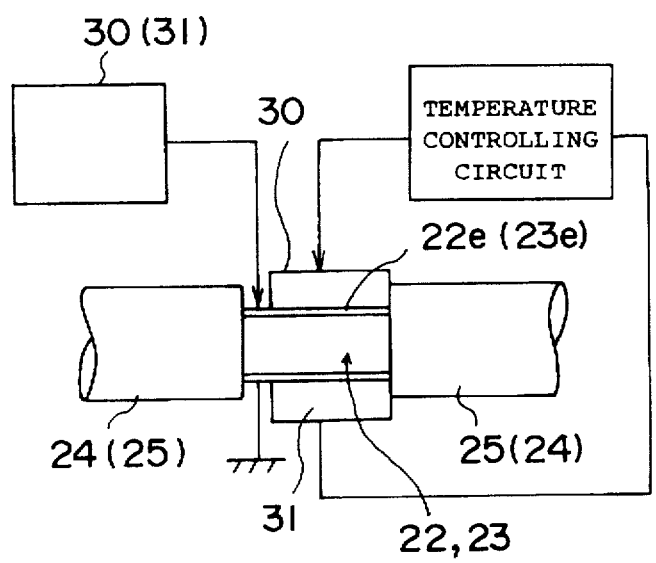
FIG. 7 is a side view showing an example of temperature control of the DFB semiconductor laser used in the phase conjugate wave generating device according to the embodiment of the present invention.

In this manner, if the output and input ends of the first and second DFB semiconductor lasers 22, 23 is placed in the loop-like optical path and then phase conjugate wave light beam generated by the first and second DFB semiconductor lasers 22, 23 may be used, as shown in FIG. 7, plural light beams can be generated at a predetermined interval. Since plural light beams having different frequencies are spread in the directional coupler 28 until the third optical fiber 29, part of these light beams can be extracted to an external device via the third optical fiber 29.

When passing through the loop-like first and second optical fibers 24, 25, anti-clockwise traveling of plural-frequency light beam can be prevented from by the isolator 26. Intensity of the light beam in first and second optical fibers 24, 25 is reduced as frequency deviates from $v_1$ or $v_2$. However, if the light beam is passed through the first and second DFB semiconductor lasers 22, 23, it is amplified because of their semiconductor gain medium and further amplification operation is accelerated with the aid of the Fabry-Perot etalon having resonance energy interval of $v_1-v_2$. Therefore, actually available frequency range can be widened.

As mentioned above, if the DFB semiconductor laser is employed to generate phase conjugate wave, the light beam having plural frequencies can be generated with the use of at least two DFB semiconductor lasers. Therefore, not only the multi-wavelength light generating device can be miniaturized but also connection of the optical fiber in the device can be significantly reduced to thus improve operation efficiency. It is of course that three DFB semiconductor lasers or more may be used in the loop-like optical path.

Although the DFB semiconductor laser 1 has been formed as a InP/InGaAsP layer structure in the above embodiment, other InP/InAlGaAs layer structure may be used. In addition, materials which is matched with the GaAs substrate may be used.

For practical use, in the phase conjugate wave generating device, light emitting diode, semiconductor laser, etc. may be used in place of the variable wavelength light source 3, and a filter 10 for transmitting only phase conjugate wave light beam may also be attached on the outside of the output end of the DFB semiconductor laser 1. The filter 10 may be arranged between the DFB semiconductor laser 1 and the lens 6, or between the lens 6 and the optical fiber 4.

As has been described above, according to an aspect of the present invention, since the DFB semiconductor laser is used as the semiconductor device to generate phase conjugate wave and a single mode light beam obtained by oscillating the DFB semiconductor laser is used as the pump beam, a mechanism for coupling the probe beam with the pump beam can be neglected to thereby simplify the structure of the phase conjugate wave generating device. In addition, there is no necessity to consider attenuation of intensity of the pump beam due to the optical fiber, and intensity of the phase conjugate wave as the output light beam can be enhances by the stronger pump beam.

Though the DFB semiconductor laser has a single oscillation mode, wavelength can be varied freely. For instance, distribution of the electric current supplied to the semiconductor laser can be altered in magnitude by splitting the electrode on one side of the DFB semiconductor laser into plural electrodes. As a result, wavelength of the phase conjugate wave can be varied freely.

Since the phase conjugate wave (light beam) generated by the DFB semiconductor laser is output together with the probe beam and the pump beam, only the phase conjugate wave light beam can be extracted by arranging the filter on the output end side of the DFB semiconductor laser.

Since waveform of the phase conjugate wave light beam appears as a reversal waveform of the probe beam if the DFB semiconductor laser is used, the DFB semiconductor laser can be used to compensate for dispersion in the optical fiber.

According to another aspect of the present invention, the loop-like optical path is provided such that the input end of one DFB semiconductor laser having different oscillation wavelength is connected to the output end of the other DFB semiconductor laser and then the input end of the other DFB semiconductor laser is connected to the output end of one DFB semiconductor laser, and the light beam passing through in the loop-like optical path is input into respective DFB semiconductor lasers as the probe beam so as to generate plural phase conjugate waves having different wavelengths. Hence, the multi-wavelength light generating device may consists of at least two DFB semiconductor lasers, the optical fiber, and the light outputting device to miniaturize the size. Moreover, reduction in the number of connecting points of the optical fiber can yield less time and labor required for assembling.

Also, insertion of the etalon in the loop-like optical path allows intensity of the light beam to be amplified. Besides, if the isolator is inserted in the loop-like optical path, component of the light beam proceeding in the reverse direction can be decreased.

Since interval between wavelengths of the light beam can be changed by varying wavelength of the DFB semiconductor laser, wavelength of the output light beam can be readily adjusted.

Various modifications will become possible for those skilled in the art after receiving the teachings of the present disclosure without departing from the scope thereof.

What is claimed is:

1. A phase conjugate wave generating device comprising:
    a distributed feedback semiconductor laser having an optical input end and an optical output end, reflection-free films capable of transmitting phase conjugate waves being formed on respective ends and grating structure enabling single mode oscillation;
    a probe beam generating light source for injecting a probe beam into said optical input end of said distributed feedback semiconductor laser;
    means for supplying electric current to said distributed feedback semiconductor laser to oscillate a pump beam; and
    means for detecting said phase conjugate waves output from said optical output end of said distributed feedback semiconductor laser by injecting said probe beam into said distributed feedback semiconductor laser which is oscillating said pump beam.

2. A phase conjugate wave generating device according to claim 1, wherein said distributed feedback semiconductor laser has a wavelength variable structure.

3. A phase conjugate wave generating device according to claim 2, wherein said wavelength variable structure includes one-side electrode which is divided into plural portions in said distributed feedback semiconductor laser, and said electric current supplying means for adjusting electric current to be supplied to said electrode.

4. A phase conjugate wave generating device according to claim 1, wherein a filter for transmitting said phase conjugate waves only is arranged on its outside of said optical output end of said distributed feedback semiconductor laser.

5. A phase conjugate wave generating device according to claim 1, wherein said distributed feedback semiconductor laser includes a $\lambda/4$ phase shift diffraction grating on its inside.

6. A wavelength converting method comprising the steps of:
    oscillating a distributed feedback semiconductor laser which has reflection-free films for transmitting phase conjugate waves on an optical input end and an optical output end by supplying electric current to it; and
    converting a wavelength by irradiating said optical input end of said distributed feedback semiconductor laser being in an oscillation state with a probe beam so as to emit light of a phase conjugate wave from said optical output end.

7. An optical dispersion compensating method comprising the steps of:
   oscillating a distributed feedback semiconductor laser which has grating structure enabling single mode oscillation and reflection-free films for transmitting phase conjugate waves on an optical input end and an optical output end by supplying electric current to it;
   inputting a probe beam which is passed through a first optical fiber and a signal waveform of which is distorted by dispersion in said first optical fiber into said optical input end of said distributed feedback semiconductor laser; and
   outputting light of phase conjugate wave, which is output from said distributed feedback semiconductor laser by inputting said probe beam, from a second optical fiber having a length identical to that of said first optical fiber after said probe beam has been restored to its original waveform by compensating said dispersion by being passed through said second optical fiber.

8. A multi-wavelength light generating device comprising:
   at least two distributed feedback semiconductor lasers which have different oscillation wavelengths;
   a loop optical path for connecting an input end of one distributed feedback semiconductor laser to an output end of a remaining distributed feedback semiconductor laser in series;
   an electric current source for supplying electric current to said at least two distributed feedback semiconductor lasers; and
   an optical output portion for extracting a part of light in said loop optical path.

9. A multi-wavelength light generating device according to claim 8, wherein an etalon is inserted into a part of said loop optical path, and resonance energy interval of said etalon is selected to be identical to difference in energy of lights oscillated by said at least two distributed feedback semiconductor lasers.

10. A multi-wavelength light generating device according to claim 8, further comprising an isolator is inserted into part of said optical path.

11. A multi-wavelength light generating device according to claim 8, said light output portion is made up of a directional branch coupler.

12. A multi-wavelength light generating device according to claim 8, wherein oscillation wavelength alternating/controlling means is provided to said at least two distributed feedback semiconductor lasers.

13. A multi-wavelength light generating device according to claim 12, wherein said oscillation wavelength alternating/controlling means is a means for controlling a quantity of electric current to every divided electrode of said at least two distributed feedback semiconductor lasers.

14. A multi-wavelength light generating device according to claim 12, wherein said oscillation wavelength alternating/controlling means controls a temperature of said at least two distributed feedback semiconductor lasers.

* * * * *